(12) United States Patent
Huang et al.

(10) Patent No.: US 6,520,652 B1
(45) Date of Patent: Feb. 18, 2003

(54) METHOD AND APPARATUS FOR REDUCING UNDESIRABLE REFLECTED LIGHT IN INTEGRATED OPTO-ELECTRONIC MODULES

(75) Inventors: Rong Huang, Woburn, MA (US); Brian Cranton, Haverhill, MA (US); Masud Azimi, Belmont, MA (US)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/993,271

(22) Filed: Nov. 14, 2001

Related U.S. Application Data
(60) Provisional application No. 60/323,639, filed on Sep. 20, 2001.

(51) Int. Cl.$^7$ ............................................. G02B 27/00
(52) U.S. Cl. ....................... 359/614; 359/601; 359/604; 359/605; 359/613
(58) Field of Search ................................ 359/614, 601, 359/604, 605, 613, 598, 591, 595, 597

(56) References Cited

U.S. PATENT DOCUMENTS

| | | | | | |
|---|---|---|---|---|---|
| 5,103,326 | A | * | 4/1992 | Fergason | ..................... 349/164 |
| 6,286,965 | B1 | * | 9/2001 | Caskey et al. | ............... 359/584 |
| 6,394,395 | B1 | * | 5/2002 | Poturalski et al. | .......... 244/173 |

\* cited by examiner

*Primary Examiner*—Mohammad Sikder

(57) ABSTRACT

A method for reducing reflection of undesirable light in an opto-electronic package includes the coating of the interior surfaces of the package with light absorbing materials. Accordingly, when stray or scattered light is incident on package surfaces, reflections are minimized and therefore the optical noise, interference and feedback are reduced.

6 Claims, 3 Drawing Sheets

METHOD AND APPARATUS FOR REDUCING UNDESIRABLE REFLECTED LIGHT IN INTEGRATED OPTO-ELECTRONIC MODULES

This Non-Provisional Patent Application claims priority to Provisional Patent Application No. 60/323,639, filed on Sep. 20, 2001 having common inventors herewith.

BACKGROUND OF THE INVENTION

As it is known in the optical communications art, light signals can be modulated in accordance with associated data signals such that the information is optically conveyed between a transmitter and a receiver. In order for that optical data to be accurately and efficiently transmitted, the undesirable reflected light, or optical noise, generated within optical components that make up the transmission, amplification, and receiving systems should be minimized. Without minimizing optical background noise levels, difficulties are encountered when trying to maximize the quality of the optical signals and the quantity of information carried by those optical signals. Undesirable reflections cause degradation in optical performance in many ways. Three of these degradation mechanisms (noise, interference, and feedback) are particularly worrisome for sealed opto-electronics modules or packages. More precisely, 'noise' from undesirable reflected light can be characterized as stray or scattered light impacting optical detectors and monitors inside opto-electronic packages. 'Interference' from undesirable reflected light involves light unintentionally entering passive optical components such as waveguides. 'Feedback' from undesirable reflected light is unwanted but relatively highly concentrated reflected light reentering the optical path.

Many modem optical components are extremely sensitive to stray or scattered reflected light generated by active components located inside the same opto-electronics module. As the performance of opto-electronics components improves, means to improve the accuracy of these sensitive components becomes desirable and one manner to do so is to reduce the amount of undesirable reflected light in the package.

Two common prior art approaches, referred to as component angling and component shielding, have been used in the past to limit the effect of undesirable light in opto-electronics packages. Angling components takes advantage of the law of regular reflection that dictates that a shiny object reflects most light coming in at a particular angle of incidence away at a specific angle of reflectance (for example, reflections from a mirror). Angling components allows some degree of control over concentrated beams of light, enabling a design to be configured to reflect undesirable light away from sensitive components.

Shielding involves placing physical barriers between undesirable reflected light and sensitive optical components. The classic example of shielding in telecommunications applications is the use of multiple, discrete opto-electronic modules connected by fiber to separate light sensitive components from light generating components.

SUMMARY OF THE INVENTION

In accordance with an aspect of the present invention, a method and apparatus are provided for eliminating or reducing undesirable reflected light in opto-electronic packages. Such an effect is achieved through disposing a light absorbing material on selected inner surfaces of the opto-electronic package such that light incident on the material is not further reflected within the package to any significant degree. With another aspect of the present invention, the light absorbing material should be selected such that it does not give off significant particulate matter in quantities significant to interfere with the operation of the opto-electronic package, should not outgas moisture or hydrocarbons in quantities significant to interfere with the operation of the opto-electronic package. One example of such a material can be pieces of Germanium.

BRIEF DESCRIPTION OF THE DRAWINGS

In the drawings, like reference characters refer to the same parts throughout the different views. The drawings are not necessarily to scale, emphasis instead being placed upon illustrating the principles of the invention. Of the drawings.

DETAILED DESCRIPTION OF THE INVENTION

In general, the present invention involves applying light absorbing materials to one or more of the internal surfaces of opto-electronics modules to reduce undesirable reflected light that could interfere with optical monitoring, passive optical components, or active optical devices. The light absorbing materials used must be compatible with the opto-electronic module environment.

Figure 1:
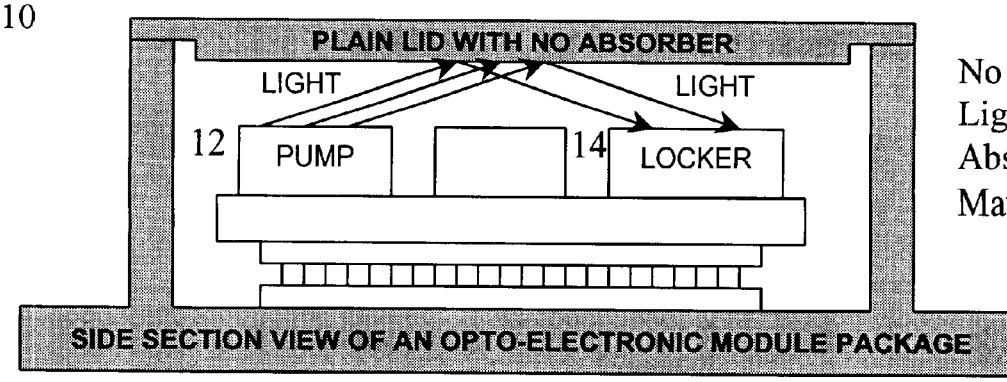
FIG. 1 is a diagram of an opto-electronic module with light absorbing materials, in accordance with an aspect of the invention.
Figure 1:
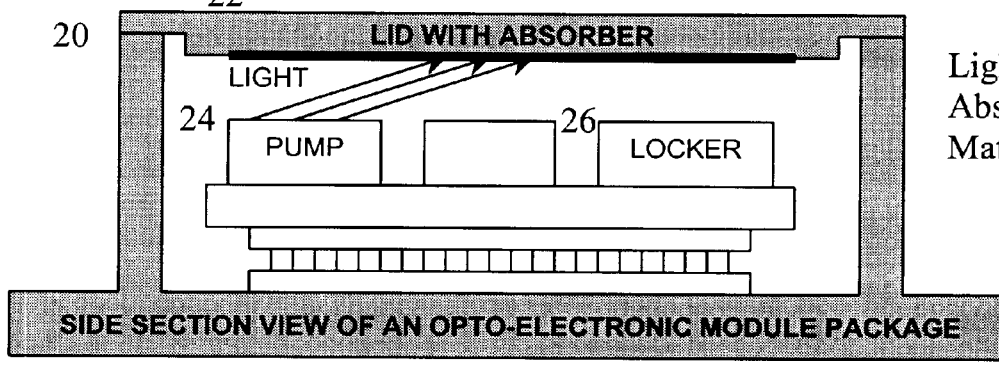

Referring to FIG. 1, opto-electronic packages 10 and 20 are shown wherein opto-electronic package 20 has light absorbing material disposed on its lid 22. In package 10 (without light absorbing material disposed on the lid) light emitted from pump laser 12 reflects off the lid of package 10 and interferes with the wavelength locker device 14. Alternatively, when the same light is emitted from pump laser 24, it is absorbed by the light absorbing material on lid 22 such that interference with other component is minimized.

The light absorbing materials used in sealed opto-electronic packages should be compatible with the environment they are placed in, typically meaning that they can not give off significant particulate matter, out-gas either moisture or hydrocarbons, need to survive harsh thermal and mechanical environments, and need to be compatible with the module manufacturing process. Particulate matter, moisture, or hydrocarbons can interfere with the performance and reliability of opto-electronic modules. The thermal and mechanical environment for telecommunications grade modules is typically specified with great care and these specifications can be very demanding. The manufacturing processes are complex and very sensitive to disruption by the addition of or modification of steps. As a result of these considerations, finding acceptable means to reduce undesirable reflected light by means of light absorbing materials in opto-electronic packages is challenging.

Figure 2:
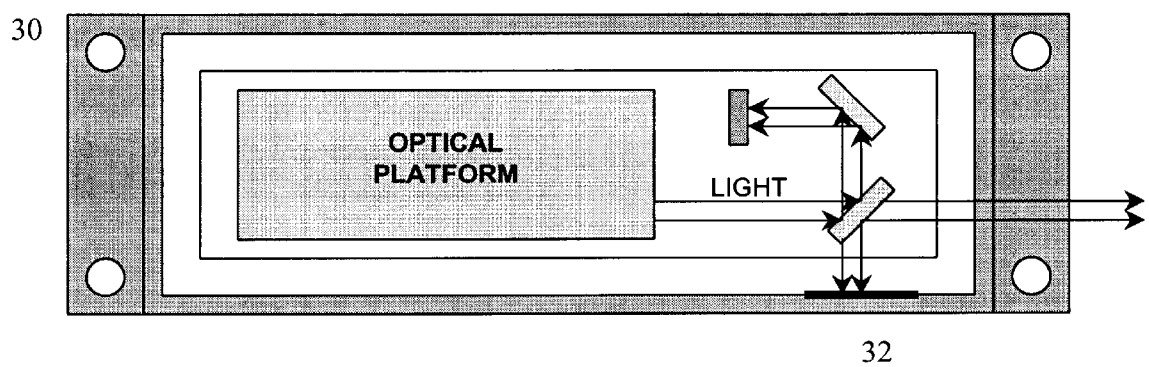
FIG. 2 is a block diagram of another opto-electronic package, similar to that shown in FIG. 1, having a light absorbing material in accordance with the invention.

Although it will be recognized by one of ordinary skill in the art that other light absorbing materials are also contemplated by the present invention, two materials have specifically been identified during the development effort for this invention that exhibit good stray light absorbing characteristics, meet the requirements for use in opto-electronic packages in telecommunications applications, and can be manufactured without causing significant assembly problems. The first is the use of thin sheets of Germanium epoxied or soldered in place. These sheets of Germanium, depending on the circumstance, may or may not have a coating applied to them. Where an opto-electronic package is being designed, the Germanium sheets can be disposed on all of the inner surfaces of the package. Such an implementation is optimal since stray light reflections will be significantly reduced in the package. However, due to design constraints such as cost and available space, for example, the present invention can be practiced by disposing the Germanium sheets on selected portions of the inner surface of the package. For example, if a pump laser is being used and produces a large amount of undesirable stray light reflecting off adjacent surfaces of the package, covering just those surfaces alone with Germanium sheets will produce significant benefits. Referring to FIG. 2, Germanium sheet 32 is only placed at one point inside opto-electronic package 30 where a large amount of unwanted light is incident on the surface.

Figure 3:
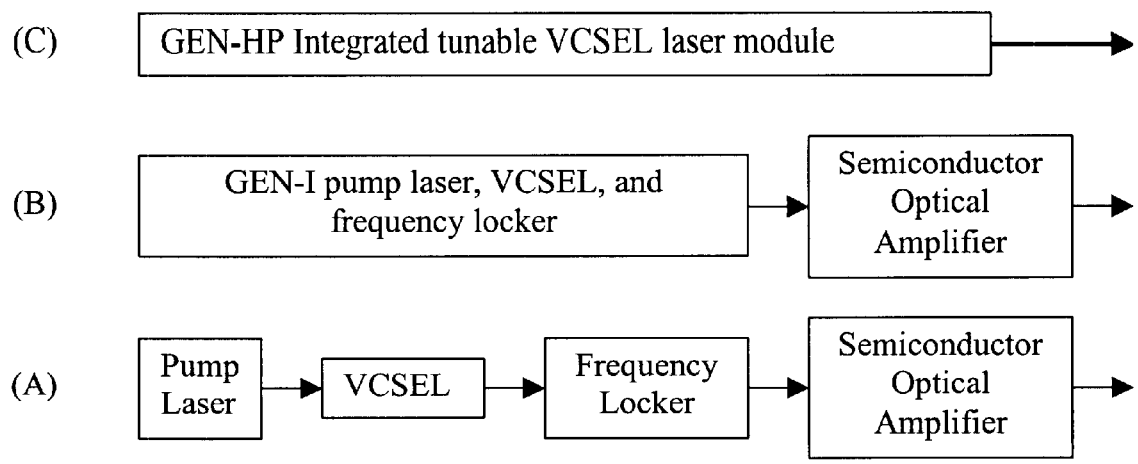
FIG. 3 is a diagram showing different levels of opto-electronic package integration, illustrating a trend from discrete packages to integrated packages which are highly susceptible to problems associated with undesirable reflected light.

Additionally, the present invention may be extended to a shield covered with or manufactured from light absorbing material such as Germanium that can be placed around one or more components. Continuing with the previous example, a shield could be fashioned that fits around the laser device or the devices sensitive to stray emissions from the laser device. The surfaces of that shield could be covered in or manufactured from Germanium sheets thereby preventing the stray light from interfering with the function of the opto-electronic package. The concept of shielding varying numbers of components within an opto-electronic package is illustrated with respect to FIG. 3. In subsection A, each component is in a separate device connected by fiber optic cable. Stray light is typically not a problem in this configuration although feedback sometimes is. In subsection B, three components, the pump laser, VCSEL, and frequency locker, are all integrated into the same package while the optical amplifier is in a discrete package. In this case, interaction of stray light from one of the three integrated components may cause problems for other integrated components. A solution to this problem is to manufacture individual component shields that may or may not be coated with light absorbing materials. In subsection C, all four components are contained in the same integrated package, allowing for maximum interaction of stray light between components and creating the most need to shielding either with or without light absorbing materials incorporated. These light-absorbing shields could, for example, be made of thin sheets or pieces of Germanium. The second light absorbing material that was specifically identified is Z-306 epoxy based black coating manufactured under the trade name Aeroglaze by Lord Corporation. One of ordinary skill in the art will recognize that many types of light absorbing coatings exist which could be applicable to the present invention. When such light absorbing coating is selected, it is applied to all, or selected portions, of the inner surfaces of the electro-optic package. Once the coating is applied, light that strikes the surfaces is not reflected, or not significantly reflected, such that the unwanted effects previously described do not occur.

It will be further recognized by those of ordinary skill in the art that the latest generations of VCSEL based tunable lasers incorporate light monitoring subassemblies with capabilities such as power or frequency monitoring. These monitoring subassemblies are very sensitive to stray or scattered reflected light from active components inside the opto-electronics module. It is desirable to improve the accuracy of these sensitive components through the use of the present invention that reduces the amount of undesirable reflected light in the package with the use of light absorbing materials, as described above.

It will be recognized that many configurations similar to those described above can be designed using different values, combinations and architectures that will yield the same results as the claimed invention. Thus, while this invention has been particularly shown and described with references to preferred embodiments herein, it is understood by those skilled in the art that various changes in form and details may be made therein without departing from the scope of the invention as defined by the appended claims.

We claim:

1. An opto-electronic communications module having reduced internally reflected light, composing:

an opto-electronic communications package having an inner surface; and a light absorbing material disposed on the inner surface of said opto-electronic communications package, said light absorbing material absorbing at least a portion of the internally reflected light.

2. An opto-electronic communications module, as described in claim 1, wherein said light absorbing material releases a low amount of particulate matter.

3. An opto-electronic communications module, as described in claim 1, wherein said light absorbing material has a low outgas of moisture or hydrocarbons.

4. An opto-electronic communications module, as described in claim 1, wherein said light absorbing material is germanium.

5. An opto-electronic communications module, as described in claim 1, wherein said light absorbing material is a light absorbing coating.

6. An opto-electronic communications module, as described in claim 1, wherein said light absorbing material is Aeroglaze Z-306 epoxy based black coating.

* * * * *